United States Patent [19]
Raghavan et al.

[11] Patent Number: 6,123,735
[45] Date of Patent: Sep. 26, 2000

[54] METHOD FOR SIMULATING BUS TRAFFIC

[75] Inventors: Rajan Raghavan, Sunnyvale;
Jonathan Warren Liu, Campbell;
Timothy Thomas Rhodes, San Jose;
Kodamanchilli Vijay Anand, Santa Clara, all of Calif.

[73] Assignee: Phoenix Technologies, Inc., San Jose, Calif.

[21] Appl. No.: 08/987,177

[22] Filed: Dec. 8, 1997

Related U.S. Application Data

[62] Division of application No. 08/425,962, Apr. 20, 1995, Pat. No. 5,715,433.

[51] Int. Cl.[7] .......................................................... G06F 9/44

[52] U.S. Cl. ................................. 703/21; 703/20; 703/22; 703/23; 710/1; 710/100

[58] Field of Search ................................. 395/500; 710/8, 710/1, 100; 703/13, 20, 21, 22, 23, 24

[56] References Cited

U.S. PATENT DOCUMENTS

| | | | |
|---|---|---|---|
| 4,611,320 | 9/1986 | Southard | 370/241 |
| 4,813,011 | 3/1989 | Kulakowski et al. | 369/32 |
| 5,311,520 | 5/1994 | Raghavachari | 714/723 |
| 5,317,537 | 5/1994 | Shinagawa et al. | 365/189.04 |
| 5,440,697 | 8/1995 | Boegel et al. | 703/21 |
| 5,533,204 | 7/1996 | Tipley | 710/108 |
| 5,557,774 | 9/1996 | Shimabukuro et al. | 703/21 |

*Primary Examiner*—Kevin J. Teska
*Assistant Examiner*—Samuel Broda

[57] ABSTRACT

A dynamic hardware emulation model (10) to be used with a hardware simulator for testing a user device (26) under test. A programming interface (12) controls a memory pool (14) and a command processor/bus manager (16) such that a command cycle is initiated to read and write data through a computer bus (24), to and from the user device (26). The programming interface (12) and the user device (26) can act in a master or slave mode. When the user device (26) is in slave mode, a slave memory (18) contains expected data for comparison purposes, and an arbiter (20) determines which device will have access to the computer bus (24).

4 Claims, 1 Drawing Sheet

METHOD FOR SIMULATING BUS TRAFFIC

This application is a division of application serial no. 08/425,962 filed on Apr. 20, 1995, U.S. Pat. No. 5,715,433.

TECHNICAL FIELD

The present invention relates generally to the field of computer hardware logic design, and more particularly to an improved simulation environment for developing and testing such hardware logic.

BACKGROUND ART

In designing and testing hardware interface logic for devices to be used with conventional bus computers, a primary task is to design hardware logic which will accomplish assigned tasks with optimal efficiency and as many desirable features as possible. For example, a video interface card intended for insertion into an industry standard Peripheral Component Interconnect ("PCI") bus computer would, ideally, quickly draw and refresh images on a video screen, with a maximum number of colors and other desirable features available. However, no matter how well designed such an interface is, it is of no value unless it communicates well with the computer's processor and other devices, as necessary, by means of the computer bus. Therefore, the makers of such hardware interfaces must give close attention to the design and testing of the interfaces for proper communication with the computer bus.

Several companies currently provide logic simulators, which are software tools which provide a means by which logic designers can emulate a working environment for hardware devices, such as the video interface card discussed above, so that the new hardware devices can be tested for proper operation in relation to the bus interface. Some of these vendors, as well as some other independent developers, provide "models" which plug into the software simulators. The models provide the necessary traffic on the bus to test new hardware interface devices. Such models are commonly written in one or both of two languages which are readily available and well known in the field: "VHDLtm" (VERY HIGH SPEED INTEGRATED CIRCUIT HARDWARE DESCRIPTION LANGUAGE) or "Verilogtm". Such models generally include a set of instructions for sending and receiving data to and from the device under test such as could be expected in a "real" application of the device, and further for storing the results of the data interchanges so that the results can be retrieved and studied at the end of the test.

Existing prior art models have performed quite effectively where there are few, or relatively few problems encountered during a test. However, as devices get even more complex, it becomes more important that models might, somehow, be able to become more interactive such that they are more of an aid in troubleshooting a complex interface problem rather than just a reporter of such problem. To the inventor's knowledge, prior to the present invention, no means has existed in the art for providing such dynamic interaction between the model, the simulator, and the device under test. All prior methods and means have generally just run preprogrammed tests and accumulated data to be studied at the end of the test.

DISCLOSURE OF INVENTION

Accordingly, it is an object of the present invention to provide a model which can react to eventualities occurring during a test.

It is still another object of the present invention to provide a model which can allow operator intervention during a test.

It is yet another object of the present invention to provide a model which can provide information about test results prior to the conclusion of the test.

It is still another object of the present invention to provide a model which can work in conjunction with commercially available simulators.

It is yet another object of the present invention to provide a model which is adaptable to be used with various bus types for testing various device types.

It is still another object of the present invention to provide a model which can be adapted for operator intervention or for programmed automatic test intervention upon the observance of predetermined test result criteria.

It is yet another object of the present invention to provide an improved means for troubleshooting new computer interface devices.

It is still another object of the present invention to provide a model that is appropriate for use by logic designers, system engineers, and VLSI chip designers.

Briefly, the preferred embodiment of the present invention is an improved model adapted for use with a PCI bus and having a programming interface (PI) controlling and directing a (primary) memory pool, a slave memory pool, a command processor/bus master (CP/BM) and an arbiter, each of which is a device affecting data traveling to and from a computer bus. For example, in the Appendices portion of the present disclosure, a PCI Bussim Model Architecture is described which includes slave pool memory, master pool memory, CP/BM, and PI elements. Specifically, page 2 of the PCI Bussim Model Architecture provides an example as follows: (There are two blocks of pool memories used by the Master (Command Processor/Bus Master—CP/BM) and Slave blocks. The pools are named Master Pool (MP) and Slave Pool (SP) depending on the block using the pool. The Pool Memory is used during a burst cycle, where individual data, wait states and byte enables are stored for each transfer of the burst. The interface to each of the Pool Memories is provided through individual set of signals connected to them, and through VHDL procedures provided by the PI).

A user device is connected to the computer bus such that, according to instructions issued from the programming interface, data is caused to travel between the bus and the user device, with verification occurring such that the nature of any failure can be readily determined and appropriate action taken (either by machine or user intervention). The unique structure of the dynamic hardware emulation model is dynamic, rather than operating in a batch mode as in the prior art, each portion of a test is individually informative and the test can be aborted, continued without interruption or automatically changed, as is appropriate to the nature of the user device and the specific test procedure being performed.

An advantage of the present invention is that users need not learn different modeling environments in order to test at different levels of design abstraction.

A further advantage of the present invention is that individual operations are separately verified such that a record is kept regarding errors and causes thereof, and further such that branching of a test can occur upon given error conditions.

Yet another advantage of the present invention is that test speed is optimized.

Still another advantage of the present invention is that development time is minimized because additional information is provided from testing, and further because futile testing is avoided.

These and other objects and advantages of the present invention will become clear to those skilled in the art in view of the description of the best presently known mode of carrying out the invention and the industrial applicability of the preferred embodiment as described herein and as illustrated in the several figures of the drawing.

BEST MODE FOR CARRYING OUT INVENTION

The best presently known mode for carrying out the invention is a dynamic hardware emulation model for use in conjunction with a computer hardware environment simulator for testing at least one user device. The predominant expected usage of the inventive dynamic hardware emulation model is in the design and testing of hardware component devices intended to be connected to the data bus of a computer.

Figure 1:
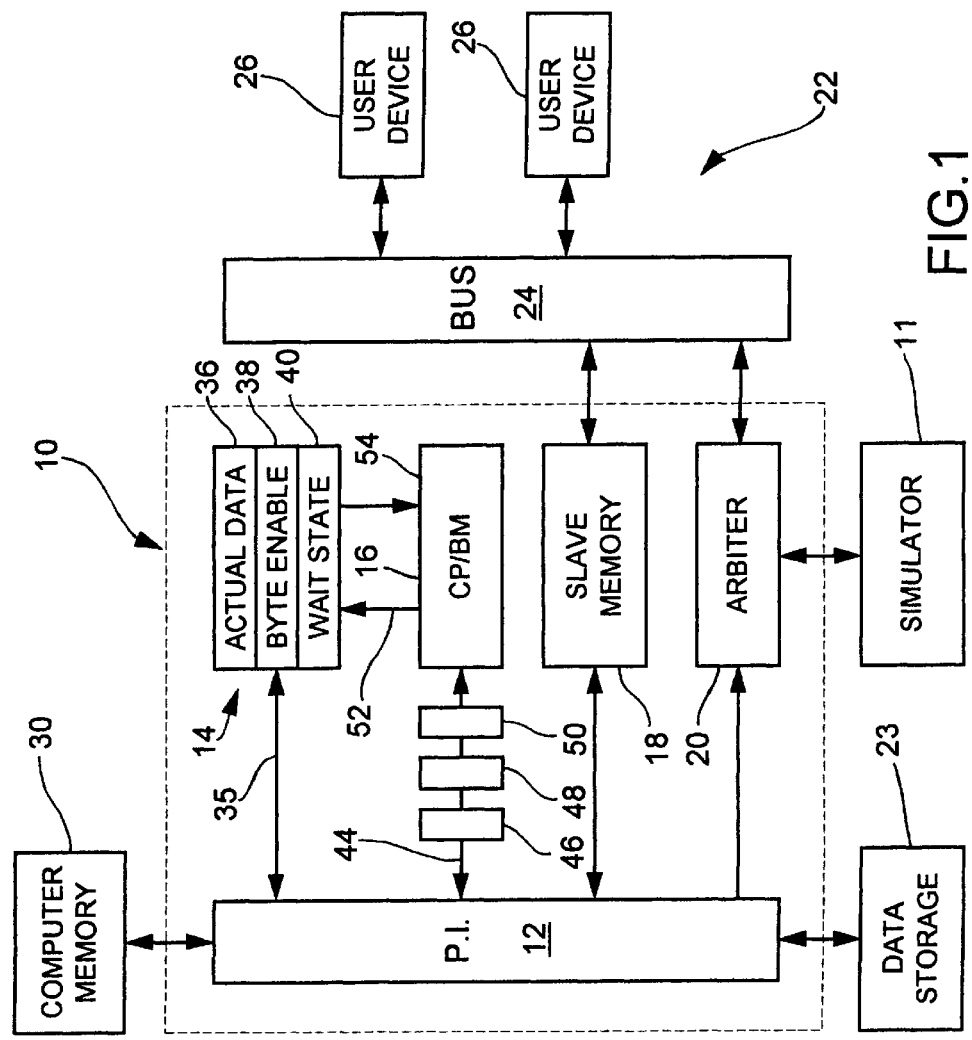
FIG. 1 is a block diagram of the inventive dynamic hardware emulation model.

The inventive dynamic hardware emulation model is depicted in a block conceptual diagram in the view of FIG. 1, and is depicted therein by the general reference character 10. One skilled in the art will recognize that a model such as the inventive dynamic hardware emulation model 10 is intended to be used in conjunction with a software test environment simulator 11, several versions of which are commercially available from Synposistm, Cadencetm, and other sources. As can be seen in the view of FIG. 1, the dynamic hardware emulation model 10 has a programming interface ("PI") 12, a pool memory 14, a command processor/bus master ("CP/BM") 16, a slave memory 18, and an arbiter 20. For example, the PCI Bussim Model Architecture in the Appendices portion of the present disclosure notes on page 9 that the slave pool memory, master pool memory, CP/BM, and arbiter are components to the system. Specifically, page 9 of the PCI Bussim Model Architecture discloses as follows: (The signal fields are used to interconnect the ports of the underlying components which is the CP/BM, the Slave Pool Memory, the Master Pool Memory, and Slave PCI Model, and the Arbiter).

The best presently known embodiment 10 of the present invention can work in conjunction with commercially available simulators. A PCI bus 24 has attached thereto (in addition to several component models (for example an arbiter, clock generator, or the like) necessary and usual for the emulation of the bus environment which are not shown for the sake of clarity) at least one user device 26 (two user devices 26 are shown by way of example in the view of FIG. 1) which is under examination. The memory pool 14 and slave memory pool 18 resides in a conventional main memory 30 of the computer system 22, and will be discussed in more detail hereinafter.

Figure 2:
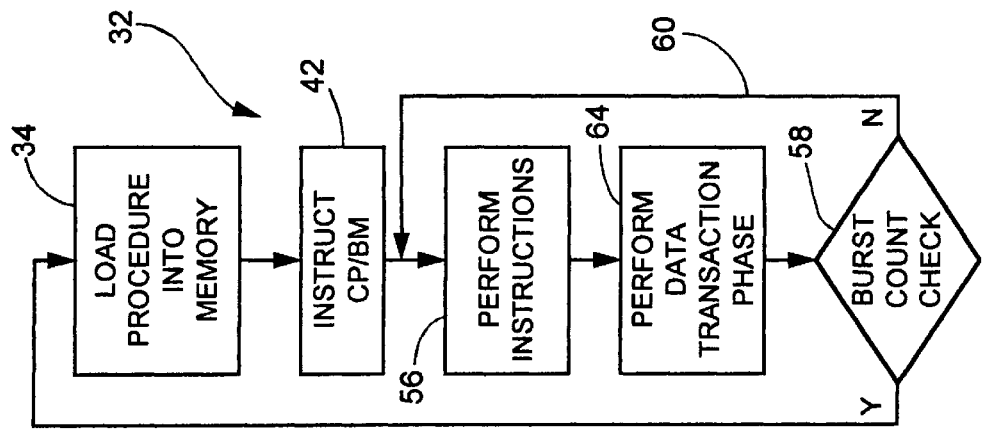
FIG. 2 is a flow diagram of a cycle of operation of the dynamic hardware emulation model of FIG. 1.

FIG. 2 is a flow diagram of a test process 32 according to the best presently known embodiment 10 of the present invention. In the example of FIG. 2 it is understood that the PI 12 has therein a series of instructions for performing a particular test or test sequence. Such instructions can optionally be placed in the PI 12 itself or retrieved from files stored in the data storage device 23 or through user intervention from the data storage device 23 and, optionally, also by individual user input (as from a keyboard or other input device, not shown). In a load procedure into pool memory operation 32 (FIG. 2) a series data for distinct operations are loaded into the pool memory 14 (FIG. 1) by means of a pool memory PI access port 35 (FIG. 1). The data stored by the load procedure into memory operation 34 will have actual data 36, byte enable 38 instructions and wait state data 40, such that a wait state and byte enable can be specified for each step of the operation. For example, the PCI Bussim Model Architecture in the Appendices portion of the present disclosure describes example operations for setting the data value, wait state value, and byte enable value to the master pool memory on page 10 as follows: (Valid operations are:

SET_DATA Sets the input data value to the Master Pool Memory.

SET_WS Sets the input wait state value to the Master Pool Memory.

SET_BE Sets the input byte enable value to the Master Pool Memory.)

In an instruct CP/BM operation 42 (shown, by way of example as following the load procedure into pool memory operation 34 in the view of FIG. 2, although the load procedure into pool memory operation 34 and the instruct CP/BM operation generally occur relatively simultaneously and may, in fact, be interspersed), instructions appropriate to the current operation are provided from the PI 12 to the CP/BM 16 via a CP/BM command link 44. As an example, where the user device 26 under test is a video graphics array ("VA") video interface card, an operation might be to write data beginning at a particular memory address, and a series of operations might be to continue to write data into the VA card, beginning at a particular address. The data to be written (the actual data 36) would be supplied to the pool memory 14, and a burst count 46, address 48 and command 50 are provided from the PI 12 to the CP/BM 16. (The burst count 46, address 48 and command 50 are illustrated graphically in the view of FIG. 1 as blocks of data on the CP/BM command link 44.) For example, the PCI Bussim Model Architecture in the Appendices portion of the present disclosure describes example operations for setting commands, burst length, and address on pages 12–13 as follows:

(SET_CMD Sets the command for the CP/BM.

SET_BURST_LEN This operation allows the burst length for the PCI cycle that is being initiated.

SET_PCI_ADDR This address for the PCI cycle is given using this operation.) In addition to the pool memory PI access port 35, the pool memory also has a CP/BM write port 52 and a CP/BM read port 54, both to enable direct communication between the CP/BM 16 and the pool memory 14.

It is known in the industry that certain commands are associated with certain bus types. For example standard commands for the PCI bus 24 are memory read, memory write, configuration read, configuration write, input/output ("I/O") read and I/O write. The inventive dynamic hardware emulation model provides a modified set of commands such that each of the commands can add an optional verify. That is, instead of just "memory read" a command can be "memory read and verify" and a "memory write" can be "memory write and verify". A "read modify write" command is also enabled in the best presently known embodiment 10 of the present invention. For example, the PCI Bussim Model Architecture in the Appendices portion of the present disclosure describes an example operation for a write verify on page 13 as follows: (C_WRITE_VERIFY Start a Write cycle and read back the same location to verify the success, of Write cycle). It is known in the industry, for example where it is desired to superimpose one image over another on a video screen, to read data (as from the user device 26 where the user device 26 is a video interface card), and to modify such data according to a complex parameter such that a composite of the "old" image (the one already showing on the screen) and a new image is written to the device 26.

The user device 26 can operate in a master or slave mode. That is, the user device 26 can be commanded, as by the PI 12, to send or receive data, or the user device 26 can itself, acting as the master, issue commands.

The slave memory 18 contains data which is read from a user device 26 when the user device 26 is in the slave mode. The arbiter 20 determines which of the user devices 26 (or other devices) has access to the bus 24, should more than one such device request access to the bus simultaneously.

Returning to the flow diagram of FIG. 2, in a perform instructions operation 56, the CP/BM 16 performs an operation as previously instructed by the PI 12, using data put into the pool memory 14 by the PI 12, and advances a burst counter. A perform data transaction phase 64 shown in FIG. 2 indicates the accomplishment of any data input or output required according to the instructions performed in the perform instructions 56 operation. In a burst count check decision operation 58, if the burst counter matches the burst count 46 (FIG. 1) previously loaded into the CP/BM then the burst counter is reset and control is returned to the PI 12 to begin the next test process 32. If the burst counter does not match the burst count 46, then the burst counter is advanced and the next perform instructions 56 operation is initiated as is shown in the view of FIG. 2 by a cycle return loop 60 indication. Each repetition of the perform instructions operation is referred to as a cycle. It should be noted that instructions issued from the PI 12 can also be "non-burst" instructions wherein a single operation rather than a series of operations is performed.

Various modifications may be made to the invention without altering its value or scope. For example, while the example of the best presently known embodiment 10 of the present invention relates to a PCI bus, the invention is adaptable for use with any such bus or similar computer hardware interconnection means. Similarly, while the best presently known 10 embodiment is written in and intended for operation with the VHDLtm language, as discussed previously herein, it is intended by the inventors that Verilogtm or other language versions of the invention be produced. Furthermore, while the user device 26 is generally illustrated herein as being a video interface card, application of the present inventive dynamic hardware emulation model 10 is by no means restricted to the development and testing of video interface cards.

All of the above are only some of the examples of available embodiments of the present invention. Those skilled in the art will readily observe that numerous other modifications and alterations may be made without departing from the spirit and scope of the invention. Accordingly, the above disclosure is not intended as limiting and the appended claims are to be interpreted as encompassing the entire scope of the invention.

INDUSTRIAL APPLICABILITY

The inventive dynamic hardware emulation model 10 is intended to be widely used, in conjunction with commercially available simulators, in the design and testing of computer interface device, such as video interface cards, that are to be inserted into the bus slots of computers.

As contrasted to existing prior art models, wherein a test had to be loaded and run in its entirety (excepting, perhaps, where a catastrophic failure might 'hang up' a system and thereby self abort a test), the inventive dynamic hardware emulation model 10 can be programmed to carry out actions based on responses from the user device 26 under test, thereby both avoiding the continuation of a fruitless test and allowing the branching of a test to a useful line of inquiry, should there be a failure. Such branching can occur simply by stopping the test and allowing the human user to decide how to then proceed, or else a more sophisticated routine might allow for the automatic branching of tests upon certain potential failure modes.

Further as contrasted to existing prior art models, wherein accumulated data had to be processed and investigated at the end of a test, the present inventive configuration allows for an operation by operation verification of test results, thus not only preventing fruitless testing, as discussed above, but also providing additional valuable information to the hardware designers. That is, as contrasted to prior art modules wherein a user would only know that an error had occurred—that data had not been transmitted or received as expected—(and then only after time consuming evaluation of accumulated data), users of the inventive dynamic hardware emulation model 10 will know the nature of the error.

The inventive dynamic hardware emulation model 10 will be readily recognized and accepted by those who use such models. The additional features, as compared to prior art models, will be easily understood. The user may not even understand or need to know that such additional features are not simply additions to prior art models, but rather required a complete rethinking of how such models are arranged, as discussed herein, in order to implement the new and useful features.

It is anticipated that, as the present invention is further developed, more sophisticated test routines and parameters will be developed both by the inventors and by other users of the dynamic hardware emulation model 10. Indeed, it is an important aspect of the present invention that the pool memory 14, the command processor/bus master 16 and the slave memory 18 are implemented and interconnected generally as presented in relation to the best presently known embodiment 10 of the present invention, thereby allowing ready access between the various component parts of the invention and providing a platform upon which further ingenuity can be built. As discussed previously herein, the inventors have provided such a flexible platform as an alternative to the prior art paradigm for a model, wherein there was no built opportunity to conform the sequence of a test according to individual need.

Each user may elect to interact with the dynamic hardware emulation model 10 in varying degrees of detail. The user may specify PCI bus commands directly, or call upon a macro command which provides the composite commands such as "read modify write" and "read verify". The 'on the fly' read verify described herein, which verifies each read transaction, eliminates the need for time consuming comparison of accumulated data to a file of expected data. This leads to higher productivity and design accuracy, when developing computer interface devices, by preventing spurious testing. Since the user interface of the dynamic hardware emulation model 10 remains constant no matter what level of detail is required in the testing, user learning time is minimized.

The VHDL implementation of the best presently known embodiment 10 of the present invention will run on any commercially available IEEE-1076 compliant VHDL simulator, although versions which will run on other simulators and hardware accelerator versions are anticipated by the inventors. The present inventive dynamic hardware emulation model 10 is intended to be used as a substitute for existing models and can be substituted therefor without substantial modification of associated hardware and software, and without substantial effort or learning on the part of users. Since the dynamic hardware emulation model 10 of the present invention may be readily produced and integrated into existing development and testing environments, it is expected that it will be readily accepted in the industry. For these and other reasons, it is expected that the utility and industrial applicability of the invention will be both significant in scope and long-lasting in duration.

The attached appendices labeled "APPENDICES TO U.S. APPLICATION ENTITLED: DYNAMIC HARDWARE EMULATION MODEL DOCKET NO. 73497-0001 RAGHAVAN ET AL. FILED APR. 20, 1995" are incorporated by reference in the entirety.

Computer Program Listing Appendix

```
--
--        COPYRIGHT © 1994 BY RAVIcad, Inc.
--        ALL RIGHTS RESERVED
--        PROPRIETARY AND TRADE SECRET
--        USAGE AND DISCLOSURE AS PER LICENSE AGREEMENT.
--

--
--        File name      :    tstarter.vhd
--        Version Num    :    2.0
--        Date           :    Oct 27th 1994
--        Author         :    TTR
--        Description    :    An example test bench, for the user to get familiar
--                            with the model.
--                            Following are demonstrated in this file:
--                                *   Ease of programming the model.
--                                *   Flexibility of debugging using the model.
--                                *   Use of high-performance commands of the model.
-                                 *   Extensive on-line documentation.
--

--
--        For purposes of simplicity, the first type of PI programming will
--        focus on the two memory pools, Master and Slave. It is not necessary
--        for a functional PCI bus be present in order to exercise
--        these parts of the AccelPCI system model. In the following
--        example, data is written to the master pool then read back, followed
--        by the direct PI interface to the slave pool.
--
--        Note: these first examples do not involve the PCI bus directly, but are used
--        as illustration of the style of programming used in this
--        sample code. It is assumed that the programmer has a basic understanding
--        of the AccelPCI architecture. If more information is desired,
--        please refer to the "AccelPCI Users Handbook".
--
--        The PI and the various components of the AccelPCI model communicate
--        through a number of procedures defined in the packages at the
--        top of this file. For more specific information about the interface
--        procedures, please refer to the "AccelPCI VHDL Model" document from RAVIcad.
--        Of special interest here are three sets of procedures:
--
--        mpSetSignal() and spSetSignal() : these two procedures apply their
--            arguments to the master and slave pool interface signals but do
--            not trigger any action by the AccelPCI model.
--
--        mpCycle() and spCycle() : these two procedures apply their commands
--            signal values as required by the operation specified and the
--            parameters passed. In addition, these also trigger execution
--            of the specified operation.
--
--        wait4mpdone and wait4spdone : these two procedures suspend the user
--            test bench until the command specified to either the MP or SP has been
--            completed. Again, recall that the architecture of the AccelPCI
--            model does not require the user test bench to participate
--            in a clock-by-clock basis with the PCI system under test.
--
--        MAIN POOL WRITE
--
--        The first loop writes 32 words into the master pool memory, the second reads
--        it back for comparison.
--
```

-continued

```
    ASSERT (FALSE)
    REPORT "Loading Main memory Pool with 32 data words."
    SEVERITY NOTE;
    for i in 0 to 16#F# loop
        be := (others => '0');
        be(i mod 4) := '1';
        mpSetSignal(mpsig, SET_BE, be);
        mpSetSignal(mpsig, SET_WS, i mod 8);
        mpSetSignal(mpsig, SET_DATA, 16#1010101# * i);
        mpCycle(mpsig, WRITE_ALL, 16#100# + i);
        wait4mpdone;
    end loop;

--
--  MAIN POOL READ
--
--  Read the data back again and compare it to the original.
--
    ASSERT (FALSE)
    REPORT "Reading Main memory Pool with 32 data words."
    SEVERITY NOTE;
    for i in 0 to 16#F# loop
        exp_data        := CONV_STD_LOGIC_VECTOR(16#1010101# * i, C_DT_WD);
        exp_be          := (others => '0');
        exp_be(i mod 4) := '1';
        exp_ws          := CONV_STD_LOGIC_VECTOR(i mod 8, C_WS_WD);
            mpCycle(mpsig, READ_ALL, 16#100# + i);
        wait4mpdone;
        ASSERT (mpsig.POOL_DATA_DO = exp_data)
        REPORT "Pool data memory readback miscompare."
        SEVERITY FAILURE;
        ASSERT (mpsig.POOL_WS_DO = exp_ws)
        REPORT "Pool wait state memory readback miscompare."
        SEVERITY FAILURE;
    end loop;
```

----

```
--
--      COPYRIGHT © 1994 BY RAVIcad, Inc.
--      ALL RIGHTS RESERVED
--      PROPRIETARY AND TRADE SECRET
--      USAGE AND DISCLOSURE AS PER LICENSE AGREEMENT.
--
```

----

```
--      File name    :   cp_bm_ctl.vhd
--      Title        :   COMMAND PROCESSOR / BUS MASTER CONTROL
--      Version      :   Behavioral to incorporate timing through generics.
--      Version Num  :   2.1
--      Date         :   Nov 7th 1994
```

----

```
--
--  This is just a portion of the CP_BM_CTL.VHD which demonstrates the
--  genration of the pool memory write enable (PB_WE_N) for PORT B and
--  address/data being fed to the PORT B (PB_DI)
--
--
PC_A <= pool_rp; -- pool read pointer
PB_A <= pool_wp; -- pool write pointer
--
--  Write the pool memory during reads from the bus, in burst mode only!
--
PB_WE_N <= cben_out when (xfer_pulse = '1' and not pci_write and not single_xfer
                         else (others => '1');
PB_DI <= AD;
--  Registers synchronous to free running clock, with asynchronous preset/clear.
FREE_RESET_REGS:
process (RST_N, FREECLK)
begin      --  FREE_RESET_REGS
    if (RST_N = '0') then
        done       <= '0';
        first_wd   <= FALSE;
        pool_rp    <= (others => '0');
        pool_wp    <= (others => '0');
```

----

```
--
--      COPYRIGHT © 1994 BY Ravicad, Inc.
--      ALL RIGHTS RESERVED
```

-continued

```
--      PROPRIETARY AND TRADE SECRET
--      USAGE AND DISCLOSURE AS PER LICENSE AGREEMENT.
--
-----------------------------------------------------------------------------------------------------------------------
--
--      File name       :       pool_ctl.vhd
--      Version Num     :       2.1
--      Date            :       Nov 7th 1994
--      Title           :       POOL MEMORY CONTROLLER
--      Purpose         :       To emulate the behavior of a triple port pool memory
--                              using only a single port RAM model. This is done
--                              by multiplexing the address, data-in, and write
--                              control signals from the 3 ports.
--                              This module is fully synthesizable.
--
-----------------------------------------------------------------------------------------------------------------------
--
--      This process forms the write pulses for all of the data, wait state,
--      and byte enable memories.
--
WRITE_PULSER:
process (PI_POOLENA, PB_WE_N, pa_cyc_vld, PA_DATA_RW_N, PA_WS_RW_N,
PA_BE_RW_N, RWCLK)
variable data_write_n   :       std_logic_vector(DATA_WE_N' range);
variable ws_write_n     :       std_ulogic;
variable be_write_n     :       std_ulogic;
begin
        --      Default is no write.
        data_write_n    := (others => '1');
        ws_write_n      := '1';
        be_write_n      := '1';
        --
        --      The CPBM directly provides the write enables when it is processing
        --      a PCI transaction, otherwise they depend on what the PI is doing.
        --
        if (PI_POOLENA = '0') then
                data_write_n := PB_WE_N;
        else
                --
                --      Write the data from the PI only when the CPBM is not busy
                --      with a PCI transaction and the PI has requested a write cycle
                --      Also write the wait states and byte enables if the PI so requ
                --
                if (pa_cyc_vld = '1') then
                        if (PA_DATA_RW_N = '0') then
                                data_write_n := (others => '0');
                        end if;
                        ws_write_n := PA_WS_RW_N;
                        be_write_n := PA_BE_RW_N;
                end if;
        end if;
        --
        --      The write pulses are formed by OR-ing (logically AND-ing) the active
        --      write enable signals with an inverted version of the read-write clock
        --
        for i in DATA_WE_N' range loop
                DATA_WE_N(i) <= data_write_n(i) or not RWCLK;
        end loop;
        WS_WE_N <= ws_write_n or not RWCLK;
        BE_WE_N <= be_write_n or not RWCLK;
end process WRITE_PULSER;
-----------------------------------------------------------------------------------------------------------------------
--
--      COPYRIGHT © 1993 BY RAVIcad, Inc.
--      ALL RIGHTS RESERVED
--      PROPRIETARY AND TRADE SECRET
--      USAGE AND DISCLOSURE AS PER LICENSE AGREEMENT.
--
-----------------------------------------------------------------------------------------------------------------------
-----------------------------------------------------------------------------------------------------------------------
--
--      File name       :       pipkg.vhd
--      Version Num     :       2.1
--      Date            :       Nov 7th 1994
--      Title           :       PCI Model's Programming Interface
--      Purpose         :       The purpose of this package is to define and describe
--                              procedures providing the Programming Interface.
--
-----------------------------------------------------------------------------------------------------------------------
```

```
--
--  The following two 'mpCycle procedures are for Writing one of the values
--  in the Pool Memory. It could be DATA, WS or BE.
--  Overloaded to pass integer or st_logic_vector address, and param to be wr
--
procedure mpCycle (
    signal    pi2mp_signal  :   inout pi2mp_rec;
    constant  operation     :   in MP_OPTYPE;
              mp_addr       :   in std_logic_vector;
              mp_param      :   in std_logic_vector
    ) is
    variable valid_operation : boolean := TRUE;
begin
    case operation is
        when  WRITE_DATA =>
              pi2mp_signal.pool_data_di    <= mp_param;
              pi2mp_signal.pool_data_rw_n  <= '0';
              pi2mp_signal.pool_ws_rw_n    <= '1';
              pi2mp_signal.pool_be_rw_n    <= '1';
        when  WRITE_WS =>
              pi2mp_signal.pool_ws_di      <= mp_param;
              pi2mp_signal.pool_data_rw_n  <= '1';
              pi2mp_signal.pool_ws_rw_n    <= '0';
              pi2mp_signal.pool_be_rw_n    <= '1';
        when  WRITE_BE =>
              pi2mp_signal.pool_be_di      <= mp_param;
              pi2mp_signal.pool_data_rw_n  <= '1';
              pi2mp_signal.pool_ws_rw_n    <= '1';
              pi2mp_signal.pool_be_rw_n    <= '0';
        when  OTHERS =>
              valid_operation := FALSE;
    end case;
    if valid_operation then
        pi2mp_signal.pool_addr <= mp_addr;
        pi2mp_signal.pool_go <= not pi2mp_signal.pool_go;
    end if;
    ASSERT valid_operation
        REPORT "mpCycle() : operation not valid !!"
        SEVERITY WARNING;
end;
```

What is claimed is:

1. A method for simulating bus traffic in conjunction with a computer device testing simulator for testing at least one user device connected to a computer bus, the method comprising the steps of:

a providing instructions from a programming interface to an operational element of a dynamic hardware emulation model, the instructions including a burst count, a command, and an address; and b executing the command reiteratively, beginning at the address, such that the command is accomplished a quantity of times equaling the burst count, and whereby data is thereby caused to travel between the bus and the at least one user device, and wherein a perform data transaction is initiated after each execution of the command to verify the command.

2. The method of claim 1, and further including:

prior to step b, providing data to a memory module, where the dynamic hardware emulation model includes the memory module; and when the command is accomplished, comparing data from the at least one user device to the data stored in the memory module.

3. The method of claim 1, wherein:

a slave memory is provided for receiving information from the at least one user device, where the dynamic hardware emulation model includes the slave memory.

4. The method of claim 3, wherein:

the at least one user device acts as a plurality of slave devices; and an arbiter is provided for determining which one of the plurality of slave devices will have access through the bus to the slave memory, where the dynamic hardware emulation model includes the arbiter.

* * * * *